US012638729B2

(12) United States Patent
Chen et al.

(10) Patent No.: US 12,638,729 B2
(45) Date of Patent: May 26, 2026

(54) ELECTRONIC DEVICE

(71) Applicant: InnoLux Corporation, Miao-Li County (TW)

(72) Inventors: Yu-Chih Chen, Miao-Li County (TW); Nai-Hsuan Cheng, Miao-Li County (TW); Shao-Hong Chen, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 475 days.

(21) Appl. No.: 18/299,834

(22) Filed: Apr. 13, 2023

(65) Prior Publication Data

US 2023/0378096 A1 Nov. 23, 2023

(30) Foreign Application Priority Data

May 17, 2022 (CN) .......................... 202210535587.0

(51) Int. Cl.
*G02F 1/1345* (2006.01)
*H05K 1/02* (2006.01)
(Continued)

(52) U.S. Cl.
CPC ....... *G02F 1/13452* (2013.01); *H05K 1/0219* (2013.01); *H10D 86/441* (2025.01); *H10D 86/60* (2025.01); *H10W 42/121* (2026.01); *H05K 2201/0715* (2013.01); *H05K 2201/09227* (2013.01)

(58) Field of Classification Search
CPC ............. H01L 23/562; H01L 23/49838; H01L 23/4985; H01L 23/528; H01L 23/5283;

H05K 1/0219; H05K 2201/0715; H05K 2201/09227; H10D 86/441; H10D 86/60; H10D 86/411; G02F 1/13452
See application file for complete search history.

(56) References Cited

U.S. PATENT DOCUMENTS

2016/0078792 A1* 3/2016 Chang .................... G09G 3/006
324/555
2020/0301535 A1* 9/2020 Choi ...................... H10K 59/40
(Continued)

FOREIGN PATENT DOCUMENTS

CN 108062183 B 11/2021

*Primary Examiner* — Premal R Patel
(74) *Attorney, Agent, or Firm* — McClure, Qualey & Rodack, LLP

(57) ABSTRACT

An electronic device is provided. The electronic device includes a substrate, a first conductive layer, an insulating layer, and a second conductive layer. The first conductive layer is disposed on the substrate. The first conductive layer has a first connection wire and a second connection wire. In a cycle, the first connection wire transmits a positive polarity signal and the second connection wire transmits a negative polarity signal. The insulating layer is disposed on the first conductive layer. The second conductive layer is disposed on the insulating layer. The second conductive layer includes a plurality of portions covering the first connection wire and the second connection wire. In addition, the number of first connection wire covered by each of the plurality of portions is equal to the number of second connection wire covered by each of the plurality of portions.

16 Claims, 5 Drawing Sheets

(51) Int. Cl.
H10D 86/40 (2025.01)
H10D 86/60 (2025.01)
H10W 42/00 (2026.01)

(56) References Cited

U.S. PATENT DOCUMENTS

2020/0321421 A1* 10/2020 Jeon ..................... H10K 59/123
2022/0358889 A1* 11/2022 Kim ..................... G09G 3/3648

* cited by examiner

ELECTRONIC DEVICE

CROSS REFERENCE TO RELATED APPLICATIONS

This application claims the benefit of China Application No. 202210535587.0, filed May 17, 2022, the entirety of which is incorporated by reference herein.

BACKGROUND

Technical Field

The present disclosure is related to an electronic device, and in particular it is related to the design of a wiring structure for an electronic device.

Description of the Related Art

Electronic products that are equipped with display panels, including tablet computers, notebook computers, smartphones, displays and televisions, have become an indispensable necessity in modern society. With the rapid development of these consumer electronics, consumers have high expectations regarding their quality, functionality, and price.

In recent years, display panels have developed towards having a narrow frame design that reduces the area of the peripheral region of the driving substrate. The wiring configuration of the fan-out area in the peripheral region is one of the key factors affecting the area of the peripheral region. Due to the structural design of the narrow frame, the line width and line spacing of the wires and other components disposed on the driving substrate need to be miniaturized accordingly to meet the requirements, resulting in increased difficulty of the manufacturing process. Furthermore, the wiring position of the fan-out area overlaps with the scribe line of the substrate. The wires are prone to damage when cutting the substrate, thereby affecting the overall performance of the finished product.

In view of the foregoing, the development of a wiring structure design that can improve the reliability or performance of electronic devices is still one of the current research topics in the industry.

SUMMARY

In accordance with some embodiments of the present disclosure, an electronic device is provided. The electronic device includes a substrate, a first conductive layer, an insulating layer, and a second conductive layer. The first conductive layer is disposed on the substrate. The first conductive layer has a first connection wire and a second connection wire. In a cycle, the first connection wire transmits a positive polarity signal and the second connection wire transmits a negative polarity signal. The insulating layer is disposed on the first conductive layer. The second conductive layer is disposed on the insulating layer. The second conductive layer includes a plurality of portions covering the first connection wire and the second connection wire. In addition, the number of first connection wire covered by each of the plurality of portions is equal to the number of second connection wire covered by each of the plurality of portions.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION

Figure 1:
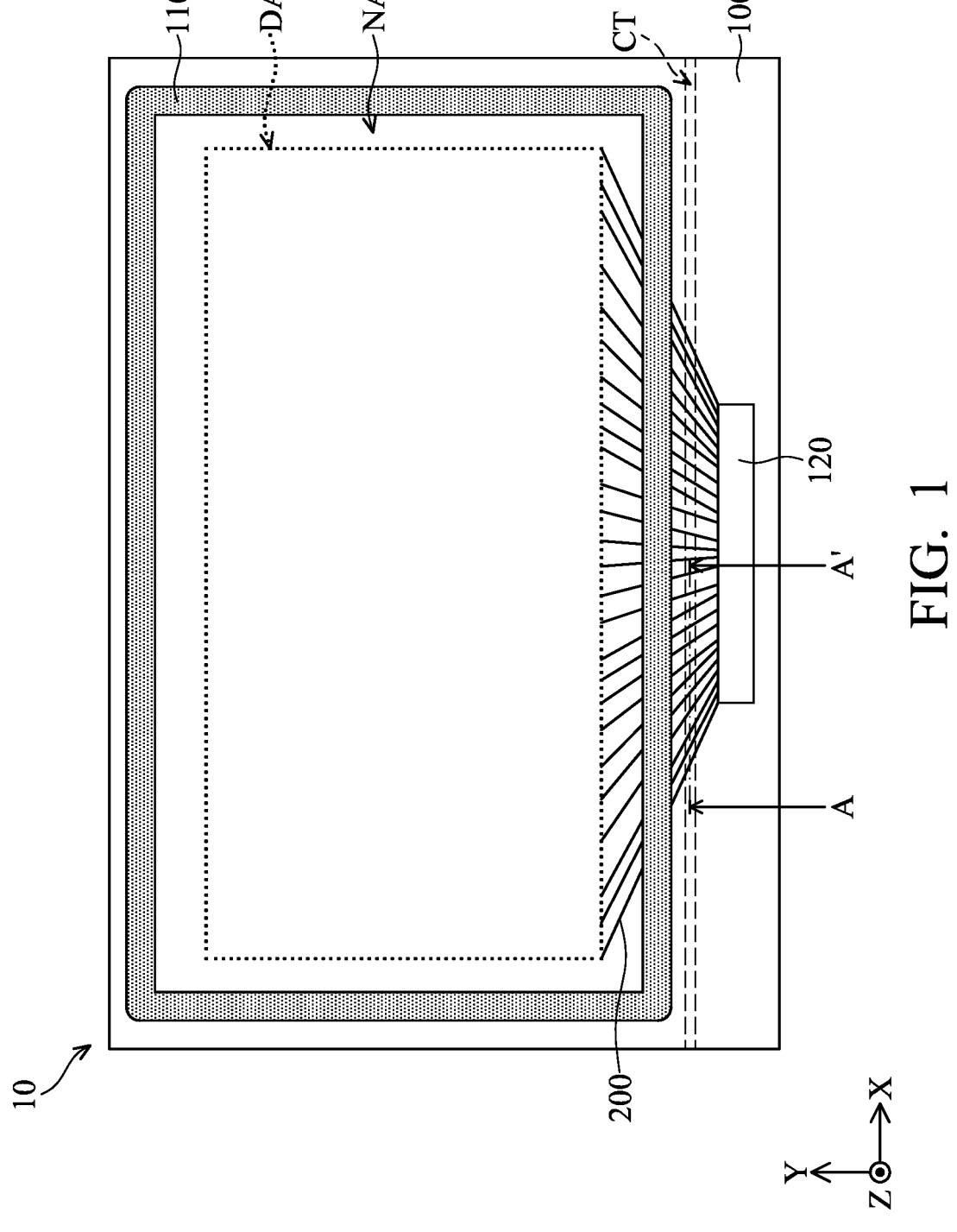
FIG. 1 is a top-view diagram of an electronic device in accordance with some embodiments of the present disclosure.

The electronic device according to the present disclosure is described in detail in the following description. It should be understood that in the following detailed description, for purposes of explanation, numerous specific details and embodiments are set forth in order to provide a thorough understanding of the present disclosure. The elements and configurations described in the following detailed description are set forth in order to clearly describe the present disclosure. These embodiments are used merely for the purpose of illustration, and the present disclosure is not limited thereto. In addition, different embodiments may use like and/or corresponding numerals to denote like and/or corresponding elements in order to clearly describe the present disclosure. However, the use of like and/or corresponding numerals of different embodiments does not suggest any correlation between different embodiments.

It should be understood that relative expressions may be used in the embodiments. For example, "lower", "bottom", "higher" or "top" are used to describe the position of one element relative to another. It should be appreciated that if a device is flipped upside down, an element that is "lower" will become an element that is "higher". The present disclosure can be understood by referring to the following detailed description in connection with the accompanying drawings. The drawings are also regarded as part of the description of the present disclosure. It should be understood that the drawings of the present disclosure may be not drawn to scale. In fact, the size of the elements may be arbitrarily enlarged or reduced to clearly represent the features of the present disclosure.

Furthermore, the expression "a first material layer is disposed on or over a second material layer" may indicate that the first material layer is in direct contact with the second material layer, or it may indicate that the first material layer is in indirect contact with the second material layer. In the situation where the first material layer is in indirect contact with the second material layer, there may be one or more intermediate layers between the first material layer and the second material layer. However, the expression "the first material layer is directly disposed on or over the second material layer" means that the first material layer is in direct contact with the second material layer, and there is no intermediate element or layer between the first material layer and the second material layer.

Moreover, it should be understood that the ordinal numbers used in the specification and claims, such as the terms "first", "second", etc., are used to modify an element, which itself does not mean and represent that the element (or elements) has any previous ordinal number, and does not mean the order of a certain element and another element, or the order in the manufacturing method. The use of these ordinal numbers is to make an element with a certain name can be clearly distinguished from another element with the same name. Claims and the specification may not use the same terms. For example, the first element in the specification may refer to the second element in the claims.

In accordance with the embodiments of the present disclosure, regarding the terms such as "connected to", "interconnected with", etc. referring to bonding and connection, unless specifically defined, these terms mean that two structures are in direct contact or two structures are not in direct contact, and other structures are provided to be disposed between the two structures. The terms for bonding and connecting may also include the case where both structures are movable or both structures are fixed. In addition, the term "electrically connected to" or "electrically coupled to" may include any direct or indirect electrical connection means.

In the following descriptions, terms "about" and "substantially" typically mean +/−10% of the stated value, or typically +/−5% of the stated value, or typically +/−3% of the stated value, or typically +/−2% of the stated value, or typically +/−1% of the stated value or typically +/−0.5% of the stated value. The expression "in a range from the first value to the second value" or "between the first value and the second value" means that the range includes the first value, the second value, and other values in between.

It should be understood that in the following embodiments, without departing from the spirit of the present disclosure, the features in several different embodiments can be replaced, recombined, and mixed to complete another embodiment. The features between the various embodiments can be mixed and matched arbitrarily as long as they do not violate or conflict the spirit of the present disclosure.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

In accordance with the embodiments of the present disclosure, an electronic device is provided, which has a specific wiring configuration in the fan-out area of the substrate. For example, by having the second conductive layer cover the same number of first connection wires and second connection wires, the voltage polarity interference between adjacent wires can be reduced, or the wires can be prevented from being damaged in the case of reduced line spacing. In accordance with the embodiments of the present disclosure, the configuration of the wiring structure can increase the capacity utilization rate of machine and improve the yield of the process.

In accordance with the embodiments of the present disclosure, the electronic device may include a display device, a touch device, a sensing device, or a tiled device, but it is not limited thereto. The electronic device may be a bendable or flexible electronic device. The display device may be a non-self-luminous display device or a self-luminous display device. The sensing device can be a sensing device for sensing capacitance, light, heat or ultrasonic, but it is not limited thereto. Furthermore, the electronic device may, for example, include liquid crystal, quantum dot (QD), fluorescence, phosphor, other suitable materials, or a combination thereof. The electronic device may include electronic components, and the electronic components may include passive components and active components, such as capacitors, resistors, inductors, diodes, transistors, and the like. The diodes may include light-emitting diodes or photodiodes. The light-emitting diodes may, for example, include organic light-emitting diodes (OLEDs), mini light-emitting diodes (mini LEDs), micro light-emitting diodes (micro LEDs) or quantum dot light-emitting diodes (QD LED), but it is not limited thereto. In accordance with some embodiments, the electronic device may include a panel and/or a backlight module, and the panel may include, for example, a liquid-crystal panel or other self-luminous panels, but it is not limited thereto. The tiled device may be, for example, a display tiled device, but it is not limited thereto. It should be understood that the electronic device can be any permutation and combination of the foregoing, but it is not limited thereto. In the following description, a display device is used as an example of an electronic device to illustrate the content of the present disclosure, but the present disclosure is not limited thereto.

Please refer to FIG. 1, which is a top-view diagram of an electronic device 10 in accordance with some embodiments of the present disclosure. It should be understood that, for clarity, some elements of the electronic device 10 may be omitted in the drawings, and only some elements are schematically shown. In accordance with some embodiments, additional features may be added to the electronic device 10 described below. In accordance with some other embodiments, some features of the electronic device 10 described below may be replaced or omitted.

The electronic device 10 may include a substrate 100. The substrate 100 may have a display region DA and a peripheral region NA, and the peripheral region NA may surround the display region DA. In accordance with some embodiments, the peripheral region NA of the substrate 100 may have a bonding region (for example, the region below the scribe line CT in FIG. 1), and the bonding region may be the region where the signal line is bonded to other electronic components. Furthermore, the electronic device 10 may include a circuit structure 200. The circuit structure 200 may extend from the display region DA to the peripheral region NA, and be electrically connected to an electronic component 120 disposed on the substrate 100. The wiring of the circuit structure 200 may be arranged in a fan-out manner. The detailed structure of the circuit structure 200 will be described below.

The substrate 100 may serve as a driving substrate, and a driving circuit (not illustrated) may be disposed on the substrate 100. The driving circuit may include an active driving circuit and/or a passive driving circuit. In accordance with some embodiments, the driving circuit may include thin-film transistors (TFTs) (e.g., switching transistors, driving transistors, reset transistors, or other thin-film transistors), data lines, scan lines, touch signal lines, conductive pads, dielectric layers, capacitors or other circuit lines, etc., but it is not limited thereto. In addition, the thin-film transistor may be a top gate thin-film transistor, a bottom gate thin-film transistor, or a dual gate (double gate) thin-film transistor. The thin-film transistor may include at least one semiconductor layer. The semiconductor layer may include amorphous silicon, low-temp polysilicon (LTPS), metal oxide, another suitable material or a combination thereof, but it is not limited thereto. The metal oxide may include indium gallium zinc oxide (IGZO), indium zinc oxide (IZO), indium gallium zinc tin oxide (IGZTO), another suitable material, or a combination thereof, but it is not limited thereto.

In accordance with some embodiments, the driving circuit may be electrically connected to the electronic component 120 through the circuit structure 200. In accordance with some embodiments, the electronic component 120 may include an integrated circuit (IC), a microchip, or another suitable electronic component that can provide electronic signals or logic signals, but it is not limited thereto. In accordance with some embodiments, the electronic component 120 may be disposed on the substrate 100 in the form of chip on film (COF) or chip on glass (COG), but it is not limited thereto. Moreover, the number of electronic components 120 is not limited to that shown in the drawing, and the electronic device 10 may have any suitable number of electronic components 120 according to different embodiments.

Furthermore, the substrate 100 may include a rigid substrate or a flexible substrate. In accordance with some embodiments, the material of the substrate 100 may include glass, quartz, sapphire, polyimide (PI), polycarbonate (PC), polyethylene terephthalate (PET), polydimethylsiloxane (PDMS), another suitable material, or a combination thereof, but it is not limited thereto. In accordance with some embodiments, the substrate 100 may include a flexible printed circuit (FPC).

In addition, as shown in FIG. 1, in accordance with some embodiments, the electronic device 10 may include a sealing element 110. The sealing element 110 may be disposed in the peripheral region NA, and the sealing element 110 may surround the display region DA. In accordance with some embodiments, the sealing element 110 may be disposed between the substrate 100 and an opposite substrate (not illustrated), and a modulation material (not illustrated, for example, may include liquid-crystal molecules) may be maintained within the sealing element 110, but the present disclosure is not limited thereto. In accordance with some embodiments, the aforementioned opposite substrate may be a color filter substrate. For example, the color filter substrate may include a substrate and a light-shielding layer and/or a color filter layer disposed thereon.

The sealing element 110 may have a single-layer structure or a multi-layer structure. In accordance with some embodiments, the material of the sealing element 110 may include polyethylene terephthalate (PET), polyethylene (PE), polyethersulfone (PES), polycarbonate (PC), polymethylmetacrylate (PMMA), epoxy resin, another suitable material, or a combination thereof, but it is not limited thereto. In accordance with some embodiments, the sealing element 110 may include light-curable adhesive, heat-curable adhesive, light-heat-curable adhesive, another suitable material, or a combination thereof, but it is not limited thereto. For example, the sealing element 110 may include optical clear adhesive (OCA), optical clear resin (OCR), pressure sensitive adhesive (PSA), another suitable adhesive material or a combination thereof, but it is not limited thereto.

It should be noted that after the substrate 100 is paired with the opposite substrate, the opposite substrate may be cut along the scribe line CT, and a part of the opposite substrate may be removed to expose a part of the substrate 100 (for example, the area below the scribe line CT in FIG. 1). However, in the normal direction of the substrate 100 (for example, the Z direction in the drawing), the scribe line CT will partially overlap with the circuit structure 200 disposed on the substrate 100. Therefore, the cutting process may cause damage to the circuit structure 200. In accordance with the embodiments of the present disclosure, the fan-out circuit structure 200 located in the peripheral region NA has a specific configuration that can reduce the risk of wire damage and reduce the voltage polarity interference between adjacent wires even when the line spacing is reduced.

Figure 2:
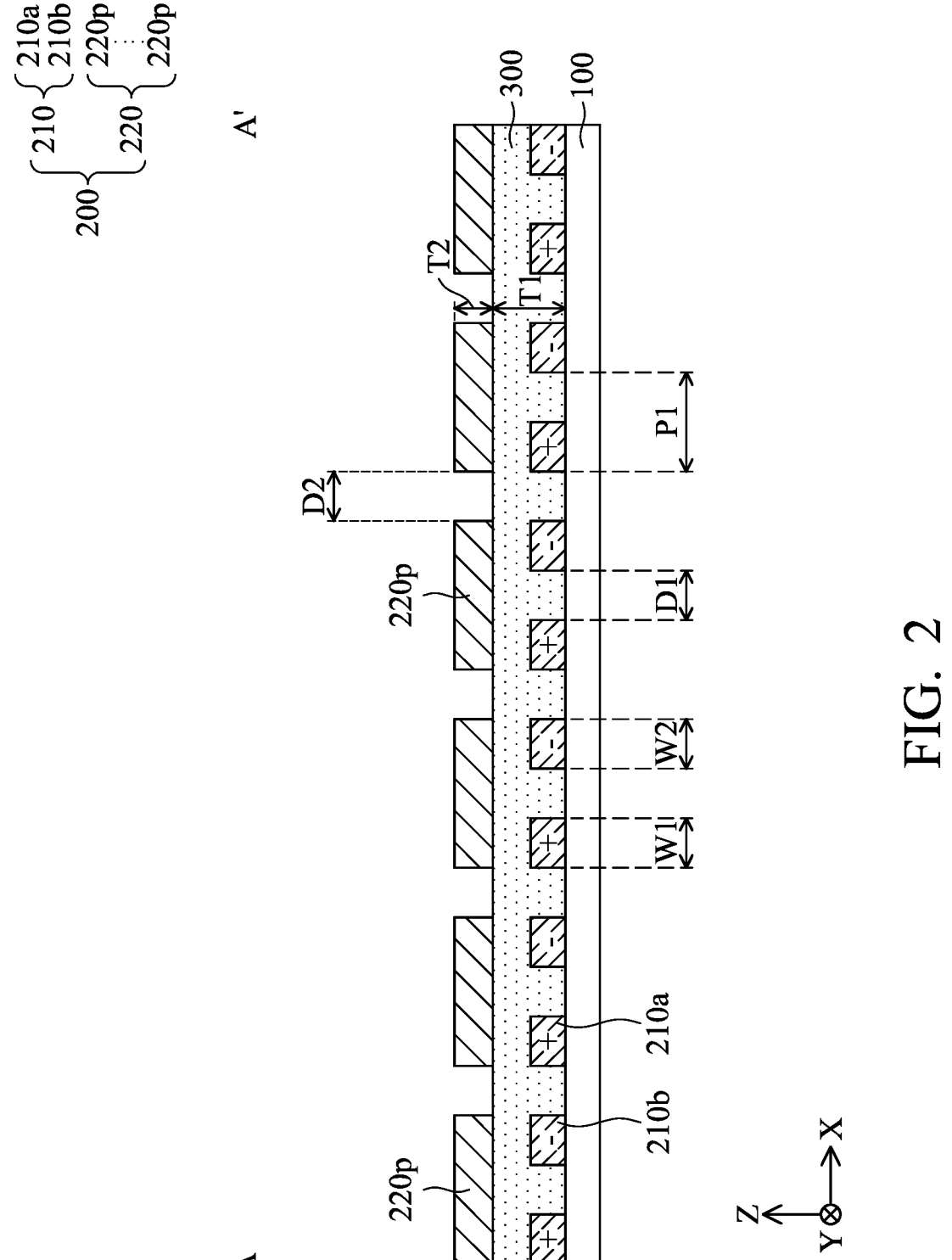
FIG. 2 is a cross-sectional diagram of an electronic device corresponding to the section line A-A' of FIG. 1 in accordance with some embodiments of the present disclosure.

Specifically, please refer to FIG. 2, which is a cross-sectional diagram of an electronic device corresponding to the section line A-A' of FIG. 1 in accordance with some embodiments of the present disclosure. FIG. 2 shows the detailed structure of the circuit structure 200.

The circuit structure 200 of the electronic device 10 may include a first conductive layer 210, an insulating layer 300 and a second conductive layer 220. The first conductive layer 210 may be disposed on the substrate 100, the insulating layer 300 may be disposed on the first conductive layer 210, and the second conductive layer 220 may be disposed on the insulating layer 300. The first conductive layer 210 may have a first connection wire 210a and a second connection wire 210b, and the insulating layer 300 and the second conductive layer 220 may cover (or extend across) the first connection wire 210a and the second connection wire 210b. In other words, in the normal direction of the substrate 100 (for example, the Z direction in the drawing), the insulating layer 300 and the second conductive layer 220 may overlap the first connection wire 210a and the second connection wire 210b. The insulating layer 300 and the second conductive layer 220 can protect the first conductive layer 210, reduce the risk of circuit damage, or reduce the corrosion or oxidation caused by the reaction of moisture or oxygen with the first conductive layer 210.

The first connection wire 210a may be used to transmit a positive polarity signal (for convenience of description, marked with the symbol "+" in the drawings) and the second connection wire 210b may be used to transmit a negative polarity signal (for convenience of description, marked with the symbol "−" in the drawings). In accordance with some embodiments, the first connection wires 210a and the second connection wires 210b may be arranged in an alternating manner. In accordance with some embodiments, the first conductive layer 210 may be electrically connected to the electronic component 120, and the first connection wire 210a and the second connection wire 210b may be used to transmit the data line signals of the driving circuit, but it is not limited thereto. It should be understood that the polarity of the signal transmitted by the first connection wire 210a and the second connection wire 210b may be changed alternately. That is, when the first connection wire 210a changes from transmitting a positive polarity signal to transmitting a negative polarity signal, the second connection wire 210b will change from transmitting a negative polarity signal to transmitting a positive polarity signal. The signal polarities of the first connection wire 210a and the second connection wire 210b may change in a specific period, but the present disclosure is not limited thereto.

Moreover, the number of first connection wires 210a covered by the second conductive layer 220 is equal to the number of second connection wires 210b covered by the second conductive layer 220. It should be noted that if the number of first connection wires 210a covered by the second conductive layer 220 is not equal to the number of second connection wires 210b so covered, it may make it impossible to offset the capacitive coupling effect when the first connection wire 210a and the second connection wire 210b are switched between high and low voltages (positive and negative polarity). This may cause an error between the actual output voltage and the ideal set voltage, thereby affecting the performance of the electronic device, for example, the brightness displayed by the pixels may be different.

More specifically, in accordance with some embodiments, the second conductive layer 220 may include a plurality of portions 220p, the plurality of portions 220p are not connected. In addition, the aforementioned portions 220p may each cover (or extend across) at least one first connection wire 210a and at least one second connection wire 210b. In other words, at least one first connection wire 210a and at least one second connection wire 210b may share a portion 220p. As shown in FIG. 2, each of the portions 220p may cover one first connection wire 210a and one second connection wire 210b, and the positive and negative polarity signals transmitted by the first connection wire 210a and the second connection wire 210b covered by each portion 220p may be the same, and the capacitive coupling effects can be offset. Therefore, the voltage polarity interference between adjacent wires can be reduced, even when the line spacing is reduced.

Furthermore, the first connection wire 210a may have a width W1, and the second connection wire 210b may have a width W2. In accordance with some embodiments, the width W1 of the first connection wire 210a may be greater than or equal to 1 micrometer and less than or equal to 10 micrometers (i.e. $1 \ \mu m \leq$ width $W1 \leq 10 \ \mu m$). In accordance with some embodiments, the width W2 of the second connection wire 210b may be greater than or equal to 1 micrometer and less than or equal to 10 micrometers (i.e. $1 \ \mu m \leq$ width $W2 \leq 10 \ \mu m$).

In accordance with the embodiments of the present disclosure, the width W1 refers to the maximum width of the first connection wire 210a in a direction perpendicular to the normal direction of the substrate 100 (for example, the X direction in the drawing). The width W2 refers to is the maximum width of the second connection wire 210b in a direction perpendicular to the normal direction of the substrate 100 (for example, the X direction in the drawing).

Moreover, there may be a distance D1 (that is, a line spacing) between adjacent first connection wire 210a and second connection wire 210b. In accordance with some embodiments, the distance D1 may be greater than or equal to 1 micrometer and less than or equal to 20 micrometers (i.e. $1 \ \mu m \leq$ distance $D1 \leq 20 \ \mu m$). On the other hand, there may be a distance D2 between adjacent portions 220p of the second conductive layer 220. In accordance with some embodiments, the distance D2 may be greater than or equal to 1 micrometer and less than or equal to 20 micrometers (i.e. $1 \ \mu m \leq$ distance $D2 \leq 20 \ \mu m$). In accordance with some embodiments, the distance D2 between the portions 220p of the second conductive layer 220 may be less than or equal to the distance D1 between the first connection wire 210a and the second connection wire 210b.

In accordance with the embodiments of the present disclosure, the distance D1 refers to the distance between the adjacent first connection wire 210a and second connection wire 210a in a direction perpendicular to the normal direction of the substrate 100 (for example, the X direction in the drawing). The distance D2 refers to the minimum distance between adjacent portions 220p of the second conductive layer 220 in a direction perpendicular to the normal direction of the substrate 100 (for example, the X direction in the drawing).

In addition, there may be a pitch P1 between the first connection wire 210a and the second connection wire 210b. In accordance with some embodiments, the pitch P1 may be greater than or equal to 1 micrometer and less than or equal to 30 micrometers (i.e. $1 \ \mu m \leq$ pitch $P1 \leq 30 \ \mu m$).

In accordance with the embodiments of the present disclosure, the pitch P1 refers to the distance between a side edge of the first connection wire 210a (for example, the left-side edge) and the same side edge (for example, the left-side edge) of the nearest second connection wire 210b in a direction perpendicular to the normal direction of the substrate 100 (for example, the X direction in the drawing).

Moreover, it should be understood that, in accordance with the embodiments of the present disclosure, a scanning electron microscope (SEM), an optical microscope (OM), a film thickness profiler ($\alpha$-step), an ellipsometer or another suitable method may be used to measure the width, thickness, or height of each element, or the spacing or distance between elements. Specifically, in accordance with some embodiments, a scanning electron microscope may be used to obtain a cross-sectional image including the elements to be measured, and the width, thickness, or height of each element, or the spacing or distance between elements in the image can be measured.

As described above, in accordance with the embodiments of the present disclosure, through the configuration design of the circuit structure 200, the voltage polarity interference between adjacent wires can be reduced, even when the distance D1 (line spacing) between the first connection wire 210a and the second connection wire 210b or the pitch P1 is quite small. In addition, it should be noted that, according to the embodiments of the present disclosure, since the second conductive layer 220 can cover (or extend across) at least one or more first connection wires 210a and at least one or more second connection wires 210b, the second conductive layer 220 may have a large width (for example, greater than the line width of the first connection wire 210a or the second connection wire 210), thereby reducing the difficulty of the process or improving the yield of the process.

Furthermore, the material of the first conductive layer 210 may include metal conductive materials, transparent conductive materials, other suitable materials or a combination thereof, but it is not limited thereto. The metal conductive material may include copper (Cu), silver (Ag), gold (Au), tin (Sn), aluminum (Al), molybdenum (Mo), tungsten (W), chromium (Cr), nickel (Ni), platinum (Pt), titanium (Ti), any of the aforementioned metal alloys, another suitable metal conductive material, or a combination thereof, but it is not limited thereto. The transparent conductive material may include transparent conductive oxide (TCO), such as indium tin oxide (ITO), antimony zinc oxide (AZO), tin oxide (SnO), zinc oxide (ZnO), indium zinc oxide (IZO), indium gallium zinc oxide (IGZO), indium tin zinc oxide (ITZO), antimony tin oxide (ATO), another suitable transparent conductive material or a combination thereof, but it is not limited thereto. In addition, the first conductive layer 210 may have a single-layer structure or a multi-layer structure.

In accordance with some embodiments, the first conductive layer 210 may be formed by a screen printing process, an inkjet printing process, a chemical vapor deposition process, a physical vapor deposition process, an electroplating process, an electroless plating process, another suitable process or a combination thereof. In accordance with some embodiments, the first conductive layer 210 may be patterned by one or more photolithography processes and/or etching processes to form a plurality of portions 220p. In accordance with some embodiments, the photolithography process may include, but is not limited to, photoresist coating (such as spin coating), soft baking, hard baking, mask alignment, exposure, post-exposure baking, photoresist development, cleaning and drying. The etching process may include a dry etching process or a wet etching process, but it is not limited thereto.

In accordance with some embodiments, the material of the insulating layer 300 may include organic materials, inorganic materials, other suitable materials or a combination thereof, but it is not limited thereto. For example, the inorganic material may include silicon nitride, silicon oxide, silicon oxynitride, aluminum oxide, another suitable material or a combination thereof, but it is not limited thereto. For example, the organic material may include epoxy resin, silicone resin, acrylic resin (such as polymethylmethacrylate (PMMA)), benzocyclobutene (BCB), polyimide, polyester, polydimethylsiloxane (PDMS), perfluoroalkoxy alkane (PFA), another suitable material or a combination thereof, but it is not limited thereto.

In accordance with some embodiments, the insulating layer 300 may be formed by a coating process, a chemical vapor deposition process, a physical vapor deposition process, a printing process, an evaporation process, a sputtering process, another suitable process, or a combination thereof.

In addition, the insulating layer 300 may have a thickness T1. In accordance with some embodiments, the thickness T1 of the insulating layer 300 may be greater than or equal to 0.05 micrometer and less than or equal to 0.8 micrometers (i.e. 0.05 $\mu$m≤thickness T1≤0.8 $\mu$m).

In accordance with the embodiments of the present disclosure, the thickness T1 refers to the maximum thickness of the insulating layer 300 in the normal direction of the substrate 100 (e.g., the Z direction in the drawing).

Furthermore, the material of the second conductive layer 220 may include transparent conductive materials, other suitable materials or a combination thereof, but it is not limited thereto. In accordance with some embodiments, the second conductive layer 220 is a transparent conductive material. The transparent conductive material may include transparent conductive oxide (TCO), such as indium tin oxide (ITO), antimony zinc oxide (AZO), tin oxide (SnO), zinc oxide (ZnO), indium zinc oxide (IZO), indium gallium zinc oxide (IGZO), indium tin zinc oxide (ITZO), antimony tin oxide (ATO), another suitable transparent conductive material or a combination thereof, but it is not limited thereto. Furthermore, the second conductive layer 220 may have a single-layer structure or a multi-layer structure.

In addition, the method for forming the second conductive layer 220 may be the same as or similar to the aforementioned process for forming the first conductive layer 210, and thus it will not be repeated here.

Moreover, the second conductive layer 220 (or the portion 220p) may have a thickness T2. In accordance with some embodiments, the thickness T2 of the second conductive layer 220 may be greater than or equal to 0.1 micrometer and less than or equal to 0.5 micrometers (i.e. 0.1 $\mu$m≤thickness T2≤0.5 $\mu$m).

In accordance with the embodiments of the present disclosure, the thickness T2 refers to the maximum thickness of the second conductive layer 220 in the normal direction of the substrate 100 (for example, the Z direction in the drawing).

It should be understood that, some components of the electronic device 10 are omitted in FIG. 2 for clarity, and only some components are schematically shown. In accordance with some embodiments, other conductive layers or insulating layers may be disposed between the substrate 100 and the first conductive layer 210. For example, other conductive layers may be used to transmit the scan line (gate line) signals of the driving circuit, and other insulating layers may include gate insulating layers, but they are not limited thereto.

Figure 3:
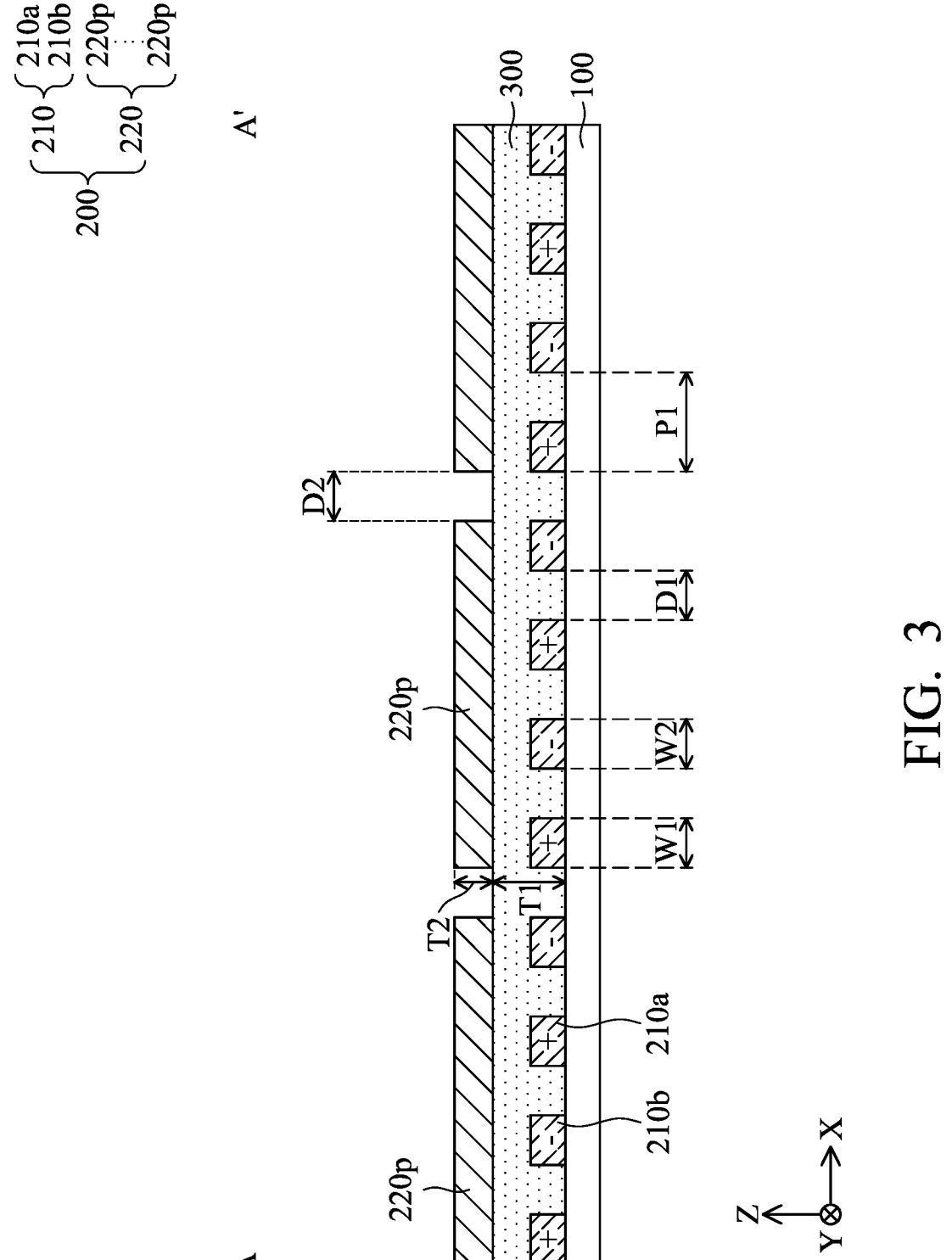
FIG. 3 is a cross-sectional diagram of an electronic device corresponding to the section line A-A' of FIG. 1 in accordance with some embodiments of the present disclosure.

Next, please refer to FIG. 3, which is a cross-sectional diagram of the electronic device 10 corresponding to the section line A-A' of FIG. 1 in accordance with some other embodiments of the present disclosure. It should be understood that the same or similar components or elements in the following descriptions will be denoted by the same or similar reference numbers, and their materials, manufacturing methods and functions are the same or similar to those described above, and thus they will not be repeated in the following context.

As shown in FIG. 3, in accordance with some embodiments, the portions 220p of the second conductive layer 220 may each cover two first connection wires 210a and two second connection wires 210b. The number of first connection wires 210a covered by the second conductive layer 220 is equal to the number of second connection wires 210b covered by the second conductive layer 220. Specifically, a total of the positive polarity signals transmitted by the first connection wire 210a and the second connection wire 210b covered by each portion 220p is equal to a total of the total negative polarity signals, and the capacitive coupling effects can be offset.

It should be understood that although in the embodiment shown in the drawings, each portion 220p of the second conductive layer 220 covers the same number of first connection wires 210a and second connection wires 210b, different portions 220p may cover different numbers of the first connection wires 210a and the second connection wires 210b in accordance with other embodiments. For example, some portions 220p of the second conductive layer 220 may cover one first connection wire 210a and one second connection wire 210b, while some portions 220p of the second conductive layer 220 may cover two first connection wires 210a and two second connection wires 210b, but the present disclosure is not limited thereto. Furthermore, the portion 220p of the second conductive layer 220 may cover a set of first connection wire 210a and second connection wire 210b (that is, one first connection wire 210a and one second connection wire 210b), or two sets, three sets, four sets, five sets or other suitable numbers of sets, and the present disclosure is not limited thereto.

Figure 4:
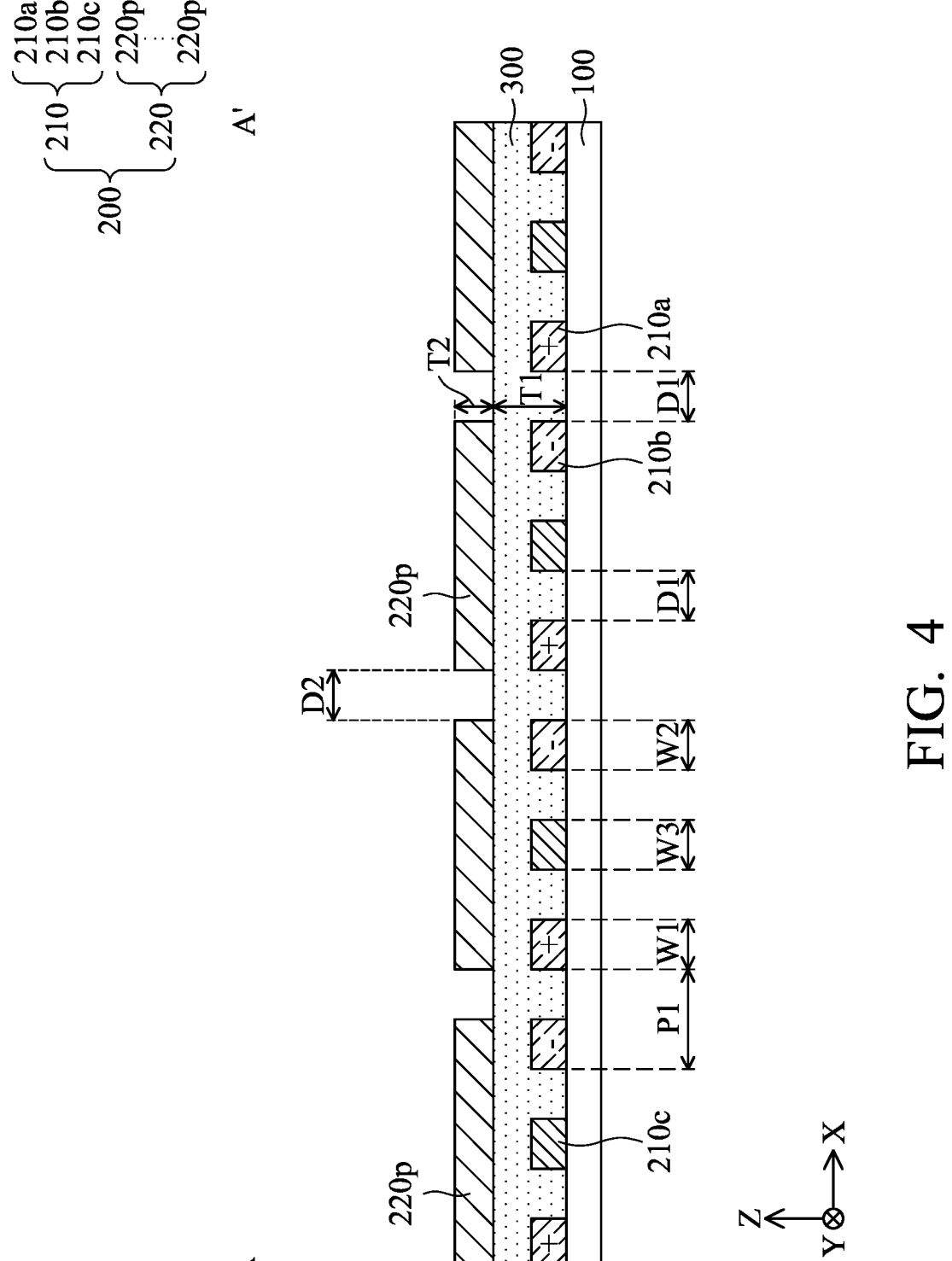
FIG. 4 is a cross-sectional diagram of an electronic device corresponding to the section line A-A' of FIG. 1 in accordance with some embodiments of the present disclosure.

Next, please refer to FIG. 4, which is a cross-sectional diagram of the electronic device 10 corresponding to the section line A-A' of FIG. 1 in accordance with some other embodiments of the present disclosure.

As shown in FIG. 4, in accordance with some embodiments, the first conductive layer 210 may further include a third connection wire 210c, and the third connection wire 210c may be disposed between the first connection wire 210a and the second connection wire 210b. Moreover, in addition to the first connection wire 210a and the second connection wire 210b, the second conductive layer 220 may further cover the third connection wire 210c. In other words, in the normal direction of the substrate 100 (for example, the Z direction in the drawing), the second conductive layer 220 may overlap the first connection wire 210a, the second connection wire 210b and the third connection wire 210c. In accordance with some embodiments, the third connection wire 210c may be used to transmit touch signals. In accordance with some embodiments, the first connection wire 210a, the second connection wire 210b and the third connection wire 210c may be arranged in an alternating manner.

In this embodiment, the number of first connection wires 210a covered by the second conductive layer 220 is also equal to the number of second connection wires 210b covered by the second conductive layer 220. Furthermore, the second conductive layer 220 may include a plurality of portions 220p, and the portions 220p are not connected. Moreover, the aforementioned portions 220p may each cover at least one first connection wire 210a, at least one second connection wire 210b and at least one third connection wire 210c. In this embodiment, the sum of the number of first connection wires 210a, the number of second connection wires 210b, and the number of third connection wires 210c covered by the portion 220p of the second conductive layer 220 is an odd number.

As shown in FIG. 4, the portions 220p of the second conductive layer 220 each cover one first connection wire 210a, one second connection wire 210b and one third connection wire 210c, and the positive and negative polarity signals transmitted by the first connection wire 210a and the second connection wire 210b covered by each portion 220p are the same. In addition, since the average value of the polarity signal transmitted by the third connection wire 210c is equivalent to close to 0, a total of the positive polarity signals and a total of the negative polarity signals transmitted by the first connection wire 210a, the second connection wire 210b and the third connection wire 210c are also the same, so that the capacitive coupling effects can be offset.

Furthermore, the third connection wire 210c may have a width W3. In accordance with some embodiments, the width W3 of the third connection wire 210c may be greater than or equal to 1 micrometer and less than or equal to 10 micrometers (i.e. 1 μm≤width W3≤10 μm).

In accordance with the embodiments of the present disclosure, the width W3 refers to the maximum width of the third connection wire 210c in a direction perpendicular to the normal direction of the substrate 100 (for example, the X direction in the drawing).

As described above, there may be a distance D1 (i.e. line spacing) between adjacent first connection wire 210a and second connection wire 210b. In this embodiment, there may also be a distance D1 between adjacent third connection wire 210c and first connection wire 210a, or between adjacent third connection wire 210c and second connection wire 210b. Furthermore, as described above, there may be a pitch P1 between the first connection wire 210a and the second connection wire 210b. In this embodiment, there may also be a pitch P1 between adjacent third connection wire 210c and first connection wire 210a, or between adjacent third connection wire 210c and second connection wire 210b.

Figure 5:
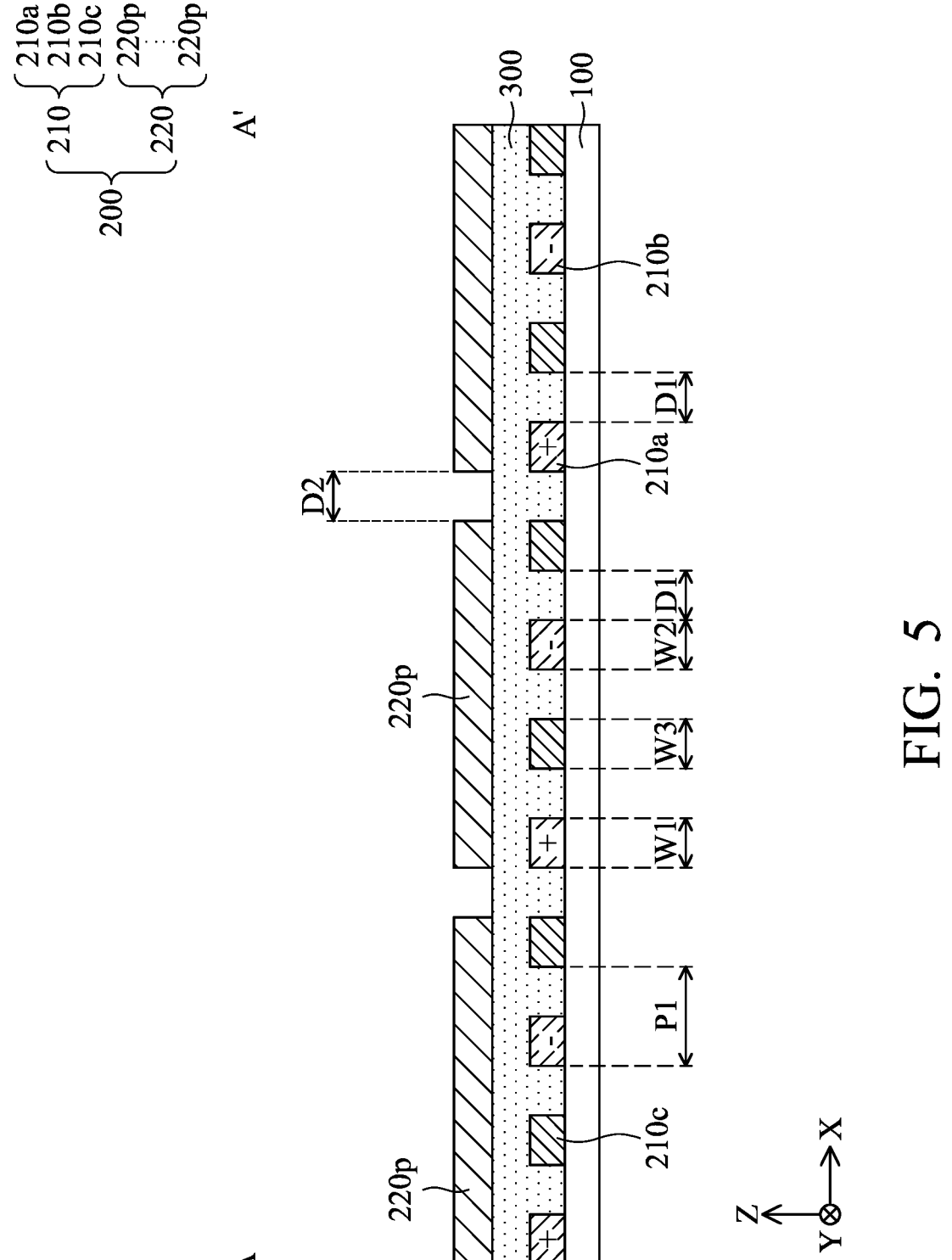
FIG. 5 is a cross-sectional diagram of an electronic device corresponding to the section line A-A' of FIG. 1 in accordance with some embodiments of the present disclosure.

Next, please refer to FIG. 5, which is a cross-sectional diagram of the electronic device 10 corresponding to the section line A-A' of FIG. 1 in accordance with some other embodiments of the present disclosure.

As shown in FIG. 5, in this embodiment, the first conductive layer 210 may further include the third connection wire 210c, and the third connection wire 210c may be disposed between the first connection wire 210a and the second connection wire 210b. Moreover, the number of first connection wires 210a covered by the second conductive layer 220 is also equal to the number of second connection wires 210b covered by the second conductive layer 220. In this embodiment, the sum of the number of first connection wires 210a, the number of second connection wires 210b, and the number of third connection wires 210c covered by the portion 220p of the second conductive layer 220 is an even number.

As shown in FIG. 5, the portions 220p of the second conductive layer 220 may each cover one first connection wire 210a, one second connection wire 210b and two third connection wires 210c. The positive and negative polarity signals transmitted by the first connection wire 210a and the second connection wire 210b covered by each portion 220p are the same. In addition, since the polarity signal transmitted by the third connection wires 210c is substantially equal to 0, a total of the positive polarity signals and a total of the negative polarity signals transmitted by the first connection wire 210a, the second connection wire 210b and the third connection wire 210c are also the same, so that the capacitive coupling effects can be offset.

As mentioned above, in the embodiment shown in the drawings, each portion 220p of the second conductive layer 220 covers the same number of first connection wires 210a, second connection wires 210b, and third connection wires 210c. However, different portions 220p may cover a different number of first connecting wires 210a, second connecting wires 210b, and third connecting wires 210c in accordance with some other embodiments, as long as the polarity signals transmitted by the first connecting wires 210a, the second connection wires 210b and the third connection wires 210c covered by the second conductive layer 220 can offset the capacitive coupling effect.

To summarize the above, in accordance with the embodiments of the present disclosure, an electronic device is provided, which has a specific wiring configuration in the fan-out area of the substrate. For example, by having the second conductive layer cover the same number of first connection wires and second connection wires, the voltage polarity interference between adjacent wires can be reduced, or the wires can be prevented from being damaged in the case of reduced line spacing. In accordance with the embodiments of the present disclosure, the configuration of the wiring structure can increase the capacity utilization rate of machine and improve the yield of the process.

Although some embodiments of the present disclosure and their advantages have been described in detail, it should be understood that various changes, substitutions and alterations can be made herein without departing from the spirit and scope of the disclosure as defined by the appended claims. The features of the various embodiments can be used in any combination as long as they do not depart from the spirit and scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Thus, the appended claims are intended to include within their scope such processes, machines, manufacture, compositions of matter, means, methods or steps. Moreover, each claim constitutes an individual embodiment, and the claimed scope of the present disclosure includes the combinations of the claims and embodiments. The scope of protection of present disclosure is subject to the definition of the scope of the appended claims. Any embodiment or claim of the present disclosure does not need to meet all the purposes, advantages, and features disclosed in the present disclosure.

What is claimed is:

1. An electronic device, comprising:
a substrate;
a first conductive layer disposed on the substrate, wherein the first conductive layer has a first connection wire, a second connection wire and a third connection wire, in a cycle, the first connection wire transmits a positive polarity signal and the second connection wire transmits a negative polarity signal, and a polarity signal transmitted by the third connection wires is equal to 0;
an insulating layer disposed on the first conductive layer; and
a second conductive layer disposed on the insulating layer, wherein the second conductive layer comprises a plurality of portions covering the first connection wire and the second connection wire, and the second conductive layer further covers the third connection wire;
wherein the number of first connection wire covered by each of the plurality of portions is equal to the number of second connection wire covered by each of the plurality of portions.

2. The electronic device as claimed in claim 1, wherein the material of the second conductive layer comprises a transparent conductive material.

3. The electronic device as claimed in claim 1, further comprising an electronic component disposed on the substrate, wherein the first conductive layer is electrically connected to the electronic component.

4. The electronic device as claimed in claim 1, wherein the first connection wire and the second connection wire are arranged in an alternating manner.

5. The electronic device as claimed in claim 1, wherein each of the plurality of portions covers at least one first connection wire, at least one second connection wire, and at least one third connection wire.

6. The electronic device as claimed in claim 1, wherein the third connection wire transmits a touch signal.

7. The electronic device as claimed in claim 1, wherein the third connection wire is disposed between the first connection wire and the second connection wire.

8. The electronic device as claimed in claim 1, wherein the first connection wire, the second connection wire and the third connection wire are arranged in an alternating manner.

9. The electronic device as claimed in claim 1, wherein a total amount of positive polarity signals transmitted through the first connection wire, the second connection wire and the third connection wire is equal to a total amount of negative polarity signals transmitted through the first connection wire, the second connection wire and the third connection wire, thereby offsetting capacitive coupling effects.

10. The electronic device as claimed in claim 1, wherein the first conductive layer and the second conductive layer partially overlap a scribe line of the substrate.

11. The electronic device as claimed in claim 1, wherein the first connection wire and the second connection wire transmit data line signals.

12. The electronic device as claimed in claim 1, wherein, for each of the plurality of portions, a total amount of positive polarity signals transmitted through the first connection wire and the second connection wire is equal to a total amount of negative-polarity signals transmitted through the first connection wire and the second connection wire, thereby offsetting capacitive coupling effects.

13. The electronic device as claimed in claim 1, wherein there is a first distance between the first connection wire and the second connection wire that are adjacent to each other, and the first distance is greater than or equal to 1 micrometer and less than or equal to 20 micrometers.

14. The electronic device as claimed in claim 13, wherein there is a second distance between two adjacent portions, and the second distance is greater than or equal to 1 micrometer and less than or equal to 20 micrometers.

15. The electronic device as claimed in claim 14, wherein the second distance is less than or equal to the first distance.

16. The electronic device as claimed in claim 1, wherein there is a pitch between the first connection wire and the second connection wire, and the pitch is greater than or equal to 1 micrometer and less than or equal to 30 micrometers.

* * * * *